(12) United States Patent
Barge et al.

(10) Patent No.: US 7,224,258 B2
(45) Date of Patent: May 29, 2007

(54) FINE LINE THICK FILM RESISTORS BY PHOTOLITHOGRAPHY

(75) Inventors: Timothy S. Barge, Lima, NY (US); Franklyn M. Collins, Lewiston, NY (US)

(73) Assignee: OhmCraft, Inc., Honeoye Falls, NY (US)

( * ) Notice: Subject to any disclaimer, the term of this patent is extended or adjusted under 35 U.S.C. 154(b) by 202 days.

(21) Appl. No.: 10/950,612

(22) Filed: Sep. 27, 2004

(65) Prior Publication Data

US 2006/0087399 A1  Apr. 27, 2006

(51) Int. Cl.
*H01C 1/012* (2006.01)

(52) U.S. Cl. ...................... 338/307; 338/195

(58) Field of Classification Search ........ 338/307–309, 338/195, 223–224; 430/287.1, 317; 156/272.2; 257/E21.534, 535, 555
See application file for complete search history.

(56) References Cited

U.S. PATENT DOCUMENTS

| | | | |
|---|---|---|---|
| 4,031,272 A | 6/1977 | Khanna | |
| 4,119,480 A * | 10/1978 | Nishi et al. | ............... 156/272.2 |
| 4,373,019 A * | 2/1983 | Watanabe et al. | ........... 430/317 |
| 4,619,836 A * | 10/1986 | Prabhu et al. | ............... 427/535 |
| 5,059,941 A | 10/1991 | Gofuku et al. | |
| 5,091,342 A | 2/1992 | Studebaker et al. | |
| 5,164,698 A | 11/1992 | Palanisamy | |
| 5,521,576 A | 5/1996 | Collins | |
| 5,548,268 A | 8/1996 | Collins | |
| 5,966,067 A | 10/1999 | Murakami et al. | |
| 5,994,997 A | 11/1999 | Brown et al. | |
| 6,171,921 B1 | 1/2001 | Dunn et al. | |
| 6,229,098 B1 | 5/2001 | Dunn et al. | |
| 2001/0012692 A1 | 8/2001 | Miller et al. | |
| 2002/0031860 A1 | 3/2002 | Tanimura | |

* cited by examiner

*Primary Examiner*—Tu Hoang
(74) *Attorney, Agent, or Firm*—Nixon Peabody LLP

(57) ABSTRACT

The present invention is directed to a thick film patterned resistor on a substrate and to a method of forming it. The method involves providing a substrate with opposed surfaces, where one surface is coated with a layer of a resistor composition. A photoresist is applied over the layer of the resistor composition, and a desired pattern in the photoresist is formed, where the pattern leaves certain regions of the resistor composition layer uncovered by the photoresist. The resistor composition layer which is uncovered by the photoresist is etched under conditions effective to leave a mass of loosely bound resistor particles at regions of the resistor composition which are not covered by photoresist. The mass of resistor particles is then removed from the substrate to produce a thick film patterned resistor on the substrate.

13 Claims, 4 Drawing Sheets

| Line width Mil | Aspect Ratio | Ink resistivity Ohm/Square | TCR ppm | VCR ppm |
|---|---|---|---|---|
| | | Metech 9000 series ink (Published characteristics) | | |
| 20 | 2 | 5.00E+08 | 300 | -1270 |
| 5.5 | 17.8 | 5.62E+07 | 90 | -39 |
| 2.5 | 86 | 1.16E+07 | 80 | -15 |
| 1 | 401 | 2.49E+06 | 50 | -5 |

Figures 2A-G

FINE LINE THICK FILM RESISTORS BY PHOTOLITHOGRAPHY

FIELD OF THE INVENTION

The present invention relates to the production of fine line thick film resistors by photolithography.

BACKGROUND OF THE INVENTION

Contemporary electronic circuitry often includes resistor components produced in the form of thin layers or films of resistive materials supported on an insulating substrate. Individual resistive elements of this type can be very small in size. Their manufacture, however, is generally done in the form of large repetitive two-dimensional arrays using wafer-scale processing techniques.

There are two distinct versions of film resistors. One version, referred to as thin film, is made using vacuum-deposited films of materials a few hundred to a few thousand angstroms in thickness. Different resistor values are achieved by forming these thin films into patterns having different length-to-width ratios, known as the aspect ratio. The patterning is done by photolithography. A layer of photosensitive polymer is deposited onto the resistive thin film. It is then exposed to a light source directed through a photo mask carrying an image of the desired pattern. The light changes the polymer solubility by special solvents, thereby exposing the underlying resistive film in selected regions. The exposed resistive film is then removed using aggressive chemical agents or plasma etching.

The range of resistivity values available by changing the film thickness is limited, to a factor of about ten, ranging from about 50 to 500 ohms per square (the unit of which is the resistance across a pattern having an aspect ratio of one). Different values are, therefore, achieved primarily by varying the aspect ratio geometrically using photolithography. Aspect ratios can be varied by a factor of many thousands, depending upon the minimum line width achievable.

Another common resistor manufacturing method is referred to as thick film. In this technology, a relatively limited range of geometrical patterns is employed and the primary way of varying the resistance value is achieved by changing the specific resistivity of the film material itself. These materials are a mixture of fine powders of glass and powders of resistive substance, typically ruthenium dioxide or ruthenate compounds. These powders are mixed with an organic vehicle to form viscous ink. The ink is deposited onto an insulating substrate in patterns using stencil screen-printing techniques. After the volatile vehicle is removed in a low temperature oven, the system is raised to a higher temperature to fuse the glass constituent, resulting in a partially conducting glaze. The specific resistivity of the glaze depends upon the relative proportions of glass and conductive phase; the resistivity can range over a factor of ten or eleven decades (i.e. orders of magnitude). The thickness of the final film is about a half a mil.

For a given resistance value, resistive elements made from thin film are generally of higher quality than those of thick film. They have a smaller temperature coefficient of resistance (TCR), a lower current noise, a smaller voltage coefficient of resistance (VCR), and greater stability throughout service life. However, for a given size, thin film elements are limited in maximum value achievable compared with thick film elements. By using thick film compositions, with reduced resistive phase, resistors can be made with a resistance several orders of magnitude higher than for thin film.

The ohmic value of thick film resistors varies significantly with its composition. At very low ohmic values, the proportion of glass phase is very low, making it unstable. As a result, it is difficult to form a continuous matrix of glass and thereby completely isolate the conductive phase of the resistor from attack by atmospheric agents. In compositions with middle level ohmic values, stability is improved. As the proportion of resistive phase is further reduced to reach higher values, however, the quality degrades in relation to the degree of dilution of the resistive phase. The TCR is higher, the current noise is greater, the current-voltage linearity is poorer, and the service life is reduced.

One way of counteracting this tendency is to use thick film compositions of moderate specific resistivity and rely on ways of achieving higher aspect ratios. As with thin films, the maximum aspect ratio achievable, within a given area, is a direct function of the minimum line width obtainable (i.e. it is inversely proportional to the square of the line width). The finer the line width, the higher the aspect ratio.

With conventional stencil screen techniques the minimum line width attainable is on the order of 10 mils. This would allow an element of 10×40 mils to be made by screen-printing with an aspect ratio of four.

An earlier idea, disclosed in U.S. Pat. No. 5,521,576 to Collins, is the discovery that higher aspect ratio patterns of thick film inks could be achieved using extrusion of ink through a small orifice in a pen tip, much as in writing. By this method, it was demonstrated that patterns based on line widths as narrow as 5.5 mils could be deposited directly onto substrates resulting in aspect ratios nearly an order of magnitude greater than could be produced by screen-printing. This means that in order to achieve a given resistance value, in a given size, an ink composition having nearly an order of magnitude lower resistivity could be used with a concomitant improved performance. Despite this improvement, the ability to write resistive lines with even finer widths is needed.

The present invention is directed to satisfying this objective.

SUMMARY OF THE INVENTION

The present invention is directed to a method of producing a thick film patterned resistor on a substrate. This method involves providing a substrate with opposed surfaces, where one surface is coated with a layer of a resistor composition. A photoresist is applied over the layer of the resistor composition, and a desired pattern in the photoresist is formed, where the pattern leaves certain regions of the resistor composition layer uncovered by the photoresist. The resistor composition layer which is uncovered by the photoresist is etched under conditions effective to leave a mass of bound resistor particles at regions of the resistor composition layer which are not covered by photoresist. The mass of unbound resistor particles is then removed from the substrate to produce a thick film patterned resistor on the substrate.

Another aspect of the present invention relates to a thick film patterned resistor on a substrate which includes a substrate and a resistor composition, comprising a binder and etchant insoluble particles, which has been sintered and patterned.

The present invention relates to a fine-line patterned thick film resistor on a planar insulative substrate having suitably deposited conductive terminals associated with each thick film resistor or with the thick film resistor network. While the term "fine-line pattern" provides only a relative measure of the fineness or width of a resistive line, the transition from a wide line to a fine line is generally regarded as that line width or fineness of the line where the influence of so-called line-edge effects on the resistance of a line becomes measurable (i.e. the line width below which the resistance value of a line becomes measurably larger than the resistance value calculated or predicted from the sheet resistivity of the resistive composition and from the nominal length and nominal width of the resistive line). This edge effect is associated with a gradually, rather than abruptly, decreasing thickness of the resistive line over a band extending outwardly from the center of the line toward each line edge (truly zero thickness). This edge effect can be observed in resistive lines prepared by traditional screen-printing and in lines prepared by a direct-write system. For directly written resistive lines, the edge effect has been observed at a nominal line width or fineness narrower than about 10 mils. Accordingly, a resistive line of nominal width equal to, or narrower than, about 10 mils is considered a fine line, or is part of a fine-line pattern.

The ability to deposit thick films in fine resistive lines affords the opportunity to select a line-to-line pitch over a wide range of line pitch, thereby providing resistance values over a wide range of values using one and the same thick film composition and one and the same line width. By decreasing the line-to-line pitch (increasing the line frequency), very high resistance values can be produced from a given thick film composition, whereby the composition can be selected with a lower sheet resistivity than heretofore possible. Lower sheet resistivity compositions generally provide resistors or resistor networks with operating characteristics of greater stability, particularly the voltage, coefficient of resistance (VCR), and the current noise index. Thus, the so-called aspect ratio of the patterned thick film resistive lines (i.e. the ratio between the total length of the resistive lines divided by the nominal width of the line) affords a geometrical design factor for thick film resistors and resistor networks which provides an improvement over what has been obtainable by conventional thick film resistor fabrication methods. Additionally, using fine-line patterns of thick film lines between terminations on an insulative substrate of a given area provides for high resistance value resistors using thick film compositions of lower nominal sheet resistivity, thereby providing thick film resistors and networks having more stable operating characteristics than obtainable by prior art devices and methods.

As described in U.S. Pat. No. 5,521,576 to Collins ("Collins"), which is hereby incorporated by reference in its entirety, with reference to FIG. 1A of that patent and FIG. 1 of the present application, resistance R is provided by a serpentine thick film pattern of a resistive line r of total line length l, whereby the serpentine pattern is shown to have a line width w and a line spacing s, the pattern extending over a total substrate area A of length L×width W. There are terminations (shown in FIG. 1A of Collins as elements 11 and 12 but not shown in FIG. 1 of the present application) connected to each of the ends of the serpentine pattern. These terminations may be made of conductive material different from the material forming the resistor pattern, and they may be deposited on the substrate prior to, or subsequent to, printing the fine-line thick film pattern.

In general, a slab-shaped resistive material of uniform thickness t, width w, and length l has a resistance $R=(\rho \times l)/(w \times t)$, where $\rho$ is the specific resistivity of the material, given in ohm cm. For a resistive film of fixed or invariant thickness, the resistance can be expressed as $R=(\rho_{sheet} \times l)/w = \rho_{sheet} \times n$, where $\rho_{sheet}$ is the sheet resistivity of the film material, given in ohms per square ($\Omega/\square$), and $n=l/w$ is referred to as the aspect ratio, which can be thought of as a number of unit areas connected in series to account for a particular geometrical arrangement of the resistor R.

Within a given total area A=length L×width W, the achievable resistance R of a patterned sheet or film of resistive materials ($\rho_{sheet}$) depends critically upon the details of the pattern. For example, in a serpentine resistive pattern, a resistive line r of width w, a line-to-line spacing s, and total line length l between conductive terminations, the resistance R of the serpentine pattern can be expressed as $$R=(\rho^{sheet} \times L \times W)/(w(w+s)) \qquad \text{Eq. (1)}$$

In the special case where the line width w and the line-to-line spacing s are equal, the resistance R is related to the geometrical factors by $$R=(\rho^{sheet} \times L \times W)/(2w^2) \qquad \text{Eq. (2)}$$

It has since been discovered that the photolithographic technique, ordinarily used with thin films, can be applied to thick resistive films, and that patterns designed with narrower line widths can be generated. This allows compositions of even lower resistivity to be employed to reach a given value with substantial improvement in stability, TCR, noise, power handling, and VCR performance. It has been found that line widths with thick film compositions down to 0.5 mil can be formed using photolithographic techniques. As a result, aspect ratios an order of magnitude higher than by direct write techniques can be achieved. In addition, the uniformity of the process enables 1% value tolerance resistors to be manufactured without laser trimming, greatly reducing cost and improving reliability. A comparison of results obtainable by different techniques of line writing is shown in FIG. 1.

DETAILED DESCRIPTION OF THE INVENTION

The present invention is directed to a method of producing a thick film patterned resistor on a substrate. This method involves providing a substrate with opposed surfaces, where one surface is coated with a layer of a resistor composition. A photoresist is applied over the layer of the resistor composition, and a desired pattern in the photoresist is formed, where the pattern leaves certain regions of the resistor composition layer uncovered by the photoresist. The resistor composition layer which is uncovered by the photoresist is etched under conditions effective to leave a mass of bound resistor particles at regions of the resistor composition layer which are not covered by photoresist. The mass of unbound resistor particles is then removed from the substrate to produce a thick film patterned resistor on the substrate.

Another aspect of the present invention relates to a thick film patterned resistor on a substrate which includes a substrate and a resistor composition, comprising a binder and etchant insoluble particles, which has been sintered and patterned.

FIGS. 2A–G are cross-sectional views showing the sequence of steps for making photo patterned multiphase thick film elements in accordance with the present invention.

Figure 1:
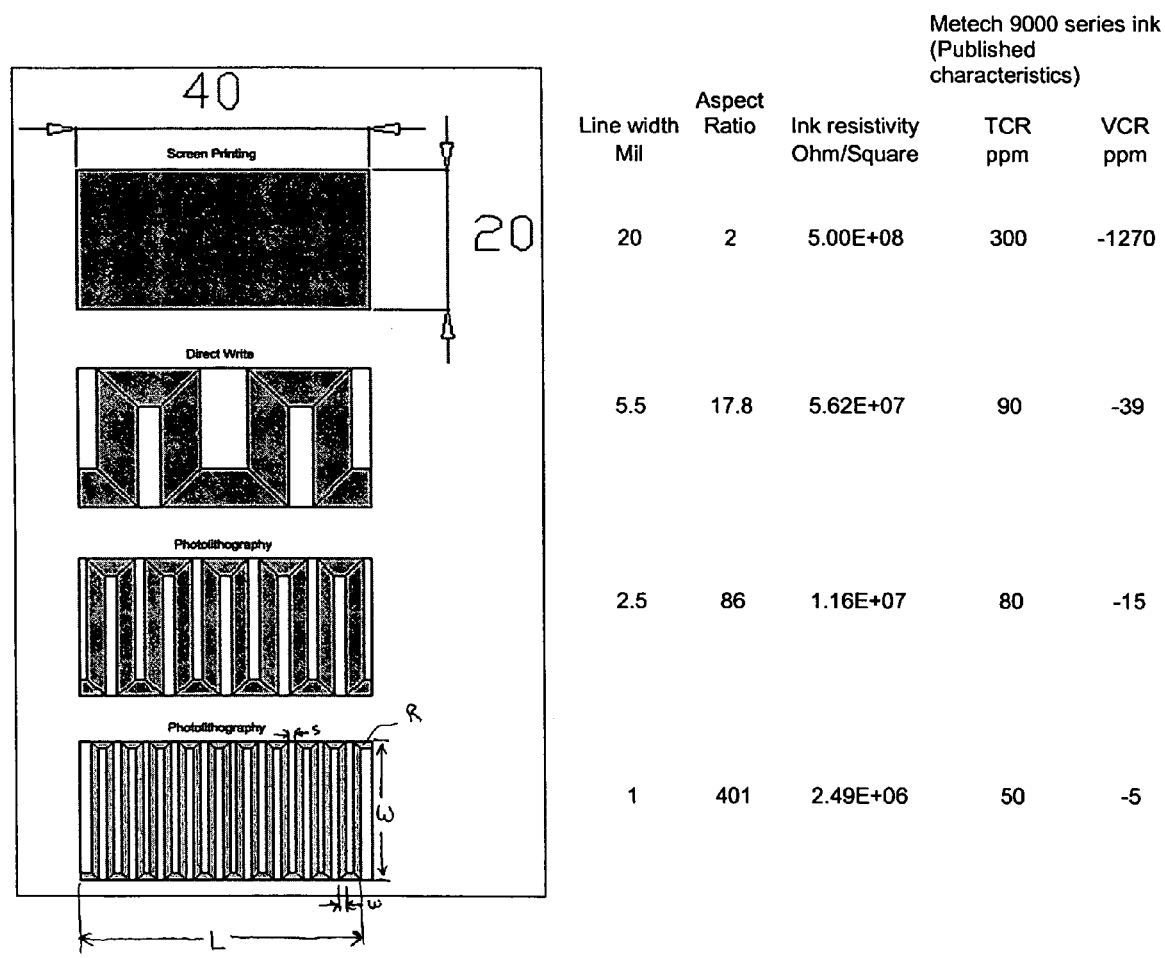
FIG. 1 is a table comparing techniques for forming resistive lines.
Figure 2A:
FIGS. 2A–G are cross-sectional views showing the sequence of steps for making photo patterned multiphase thick film elements in accordance with the present invention.

FIG. 2A shows substrate 2 in cross-section. The substrate can be any substrate material suitable for the manufacture of thick film devices, such as, but not limited to, alumina, beryllium oxide, aluminum nitride, sapphire, magnesium titanate, barium titanate, neodymium titanate, zirconium tin titanate, zirconia toughened alumina, yttria partially stabilized zirconia, boron nitride, diamond, silicon, and silicon coated with insulating materials. The substrate must be at least as clean as those substrates used in conventional thick film manufacturing. It should not have a glass planarizing layer added to its surface. Preferably, the substrate is at least 96% alumina, most preferably 99.6% ground, polished alumina.

Figure 2B:

As shown in FIG. 2B, a uniform layer of resistive thick film ink 4 is applied to cover the top surface of substrate 2.

Typically, the resistive thick film ink is formed from a fused structure of conductive or resistive materials in a vitreous, nonconductive or semiconductive binder. These resistive elements may include such materials as oxides or oxide compounds of indium, thallium, ruthenium, palladium, tungsten, osmium, iridium, and rhodium as well as gold, silver, platinum, and palladium, either in elemental form or in compounds. Some compositions contain modifiers such as zinc, bismuth, manganese, or nickel oxide. In finely divided powder form, these elements or their compounds become the conducting particles of the cermet resistor. Particle size of the conducting phase generally ranges from 0.2 to 2.0 μm.

In the formulation stage, the vitreous nonconducting binder of the fired ink (i.e. frit) is also a finely divided material. Average particle sizes of the frit range from 0.5 to 10 μm. Suitable binder components include aluminum, barium, bismuth trioxide, boroaluminosilicate glass, boron, calcium oxide, copper, fused silica (amorphous), gadolinium, glass frit, lead, lead compounds, leaded glass frit, manganese compounds, potassium, ruthenium, silica (amorphous), sodium, $TiO_2$, vanadium, zinc, zirconium, and zirconium silicate. The composition of the ink varies with the intended firing temperature and may range from a mixture of lead bismuth borosilicate and zirconium oxide for an intended firing temperature of 1000° C. to a mixture of lead bismuth and lead oxide for temperatures of 750° C. Some currently used frit formulations are listed in Table 1 with the recommended firing temperature. The frit and the metals and/or oxides constitute the fired film, but, in paste form, they represent approximately two-thirds of the composition by weight.

The resistive thick film ink may also include polymeric resins (to achieve a desired rheology), a solvent (for dilution of solid components), and a surfactant (for dispersion).

Suitable polymeric resins are alkyl phenolic resin, dimethyl glutartrate, dimethyl succinate, ethyl cellulose, ethyl hydroxyethyl cellulose, gum dammar, hydrogenated methyl ester of rosin, maleic acid resin, modified epichlorohydrin resin, and olefinic polymer or combinations thereof.

Suitable solvents are 2,2,4-trimethyl 1-1,3-pentanediol isobutyrate, castor oil derivative, dehydrated castor oil, di(2-ethylhexyl)phthalate, diethylene glycol dibutyl ether, diethylene glycol monobutyl ether, dimethyl phthalate, dioctyl phthalate, ethylene glycol monobutyl ether acetate, glycerides (mixed decanoyl and octanoyl), mineral spirits, tall oil, terpineol (mixed isomers), and tridecyl alcohol.

Suitable surfactants are fatty acids and organic phosphate.

The resistive thick film ink composition of the present invention can include: 1 to 95, preferably 20 wt % oxide; 1 to 99, preferably 40 wt % binder; 1 to 40, preferably 20 wt % polymeric resin; 1 to 40, preferably 20 wt % solvent; and 0 to 5, preferably <1 wt % surfactant.

An example of a suitable thick film resistor ink is 25 wt % organic vehicle system; 5 wt % ruthenium oxide; 2 wt % other oxide; and 68 wt % Pb bearing glass. The organic vehicle system enables precision screen printing. It includes resin, solvent, and surfactant. After the ink is screen printed on the substrate, the solvent system in this ink can be removed by evaporation. The remainder of the ink is then capable of being fired at 850° C. so that the fired resistor remaining is composed of about 9% ruthenium oxide and other oxides in 91% Pb bearing glass.

The ink is typically applied by screen printing which can be both accurate and economical. It may be applied by any suitable application method, such as spray, spin, or transfer techniques. The average thickness of layer 4 is 0.0001 to 0.0015 inches, with the actual thickness chosen to co-optimize final device performance characteristics and repeatability. Thickness uniformity is critical to manufacturing yield, because other process factors are easily controlled to about 1%. Many inks can be optimally reflowed by radiant warming of the ink paste immediately after application and prior to the evaporation of the carrier solvent. The ink is dried and then fired at carefully controlled times and temperatures. Typically, temperature is held at a peak value of 850° C. in a controlled gas environment. For some applications and inks, it is beneficial to repeat the screening and firing with a second layer of thick film ink. The second layer greatly reduces the probability of pinholes, which might adversely affect the integrity of the very narrow resistor lines.

Figure 2C:

Next, as shown in FIG. 2C, a layer of photoresist 6 is applied over resistive thick film ink layer 4. The resist may be positive working photoresist, negative working photoresist, photoimageable epoxy, photo imageable polymide, or dry sheet resist.

The photoresist might be any commercially available system, including, but not limited to the following:

TABLE 1

| Glass Frit Formulation | Firing Temperature (° C.) |
| --- | --- |
| $PbBiBSiO_2 + ZrO_2$ | 980–1050 |
| $PbBiBSiO_2$ | 850 |
| $PbBi + PbO_2$ | 775 |
| $PbZrO_2 + SiO_2$ | 760 |

| Supplier | Positive Resist | Negative Resist |
| --- | --- | --- |
| Eastman Kodak | Micropositive 800 series | Microresist 700 series |
| J T Baker | Baker 1-PR | |
| American Hoechst | "AZ-1300, 4000 series" | |
| Shipley | "AZ-1400, 2400 micropositive" | |

-continued

| Supplier | Positive Resist | Negative Resist |
|---|---|---|
| Phillip A. Hunt | Waycoat H PR-2000 series Waycoat HNR | HR series |
| Macdermind | "Ultramac PR 73, 74" | |
| Allied Chemical | Acculith | |
| E.M. Chemicals | Selectilux P-series | Selectilux N |

Alternatively, the photoresist might be replaced with photo imageable epoxy, or photo imageable polyimide or dry sheet resist such as Riston, by DuPont.

The resist is typically applied by spin coating but may be applied by spray coating or any other method capable of achieving a satisfactory photoresist thickness and uniformity.

Some thick film ink systems are very difficult to etch. These inks may be more successfully patterned by pre-etching the fired ink layer before applying the photoresist. A brief etch, for example, for about 1 second with a 1:1:7 etchant, improves the robustness of the adhesion between the roughened ink surface and the photoresist. Pre-etching is not required for all inks, but has not been found harmful to any.

Preferably, the Clariant AZ 1518 positive photoresist is used. AZ1518 is available from Clariant Corporation, AZ Electronic Materials, P.O. Box 3700, 70 Meister Avenue, Somerville, N.J. 08876-1258. It contains 71% 1-methoxy-2-propanol acetate, <30% Cresol-novalak resin, and <10% diazonapthoquinonesulfonic ester. It is applied by spin coating in a 40 second cycle with a maximum speed of 1500 RPM. It is post-baked at 90° C. for 60 seconds.

Figure 2D:
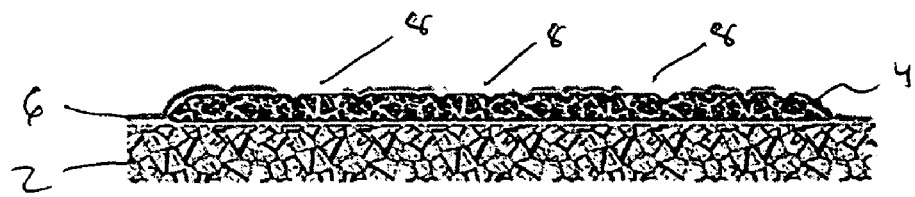

FIG. 2D illustrates the next step of the process of the present invention whose photoresist layer 6 is imagewise exposed and chemically developed. As a result, a pattern of spaces 8 are formed in photoresist 6 to achieve a desired pattern. Exposure can be carried out with various forms of light, including Hg g, h, and i lines. UV exposure for 10 seconds at 45 mW/cm$^2$ is particularly preferred. After exposure, a chemical developer is used to remove exposed positive working photoresist or unexposed negative working photoresist. Suitable chemical developers include those designed to work with the chosen resist systems. Preferably, chemical development is carried out for 30 seconds in AZ 300 MIF Developer, which is available from Clariant Corporation, EZ Electronic Materials, P.O. Box 3700, 70 Meister Avenue, Somerville, N.J. 08876-1258. It contains 2% tetramethylammonium hydroxide. The patterned resist is then baked (preferably for 135° C. for 4 minutes) to optimize its resistance to the chemical etchant. The resist remains on areas which are to be protected from the etchant and, therefore, will remain on the substrate. Since the etchant removes the glass binder from between insoluble particles, which constitute the fired ink matrix, the etch profile is typically not isotropic. The etch rate perpendicular to the substrate surface is generally higher than the etch rate parallel to the surface, but there will be some etching under the edge of the photoresist. This lateral etching (i.e. undercutting) results in a final line width which is narrower than the line width in the photoresist. The optimum line width at the photoresist stage must be determined by evaluation of lateral etching, which varies from ink to ink. Typically, the lateral etching is on the order of 0.0005 inch for a fired ink layer which is 0.0006 inches thick. Some inks have lateral etching as low as 0.0001 inches.

Figure 2E:
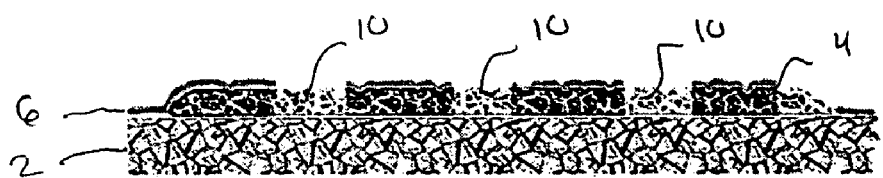

Next, as shown in FIG. 2E, substrate 2 with patterned photoresist 6 is subjected to chemical etching to remove a small fraction of the fired thick film ink that is soluble in the etchant. Predominately, the fired thick film ink is comprised of insoluble particles of metals, oxides, pyrochlores, and addenda, which may or may not be partially attached to each other as a result of sintering during the firing of the ink. The lesser component of the fired ink is generally the glass binder. The glass binder glues the particles together as mass 10 and provides most of the mechanical strength of the fired film. The glass is soluble in hydrofluoric acid. A mixture of HF, $HNO_3$, and water is very effective at removing the binder from between the particles. A solution of 1 part HF to 1 part $HNO_3$ to 1 part $H_2O$, by volume (1:1:1 etchant), is appropriate for etching thick film inks for many sheet resistance values.

Figure 2F:
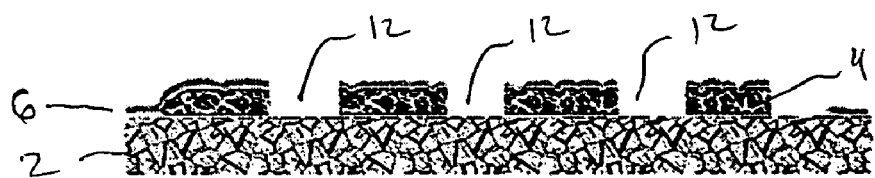

The next step of the process of the present invention is shown in FIG. 2F where mass 10 of particles is removed, preferably by mechanical means. Some etched inks leave particles so loosely bound that a moderate pressure stream of water can remove them. Some etched inks require ultrasonic agitation. Some require an aggressive detergent in addition to ultrasonic agitation. Some require multiple etch and "scrub" cycles, with a cloth, brush, or other material, to gradually remove the binder and particles all the way down to the substrate, with minimal damage to the photoresist. It is possible, and in some cases desirable, to continue "scrubbing" cycles to clear the particles from between the desired lines, even after the photoresist has been removed. See FIG. 2G. For example, it is desirable to remove the photoresist for most applications. Removing the resist by "scrubbing" can eliminate several process steps required to chemically remove the resist. Another benefit, for some systems, is to improve the electrical performance uniformity by minimizing physical, chemical, and electrical differences in the surface of lines which will be coated with conductor materials.

Figure 2G:
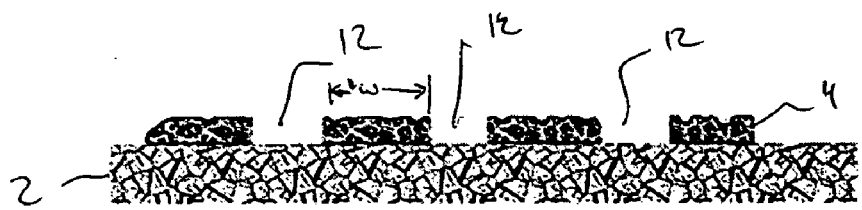

As shown in FIG. 2G, the final step in the process of the present invention is the removal of photoresist 6. The photoresist can be removed using conventional photoresist stripper. Suitable strippers include those designed to work with the chosen resist systems. It can also be removed by ultrasonic agitation in appropriate solutions with or without detergents. In some applications, the photoresist can be removed during firing of subsequent layers. After removal of the photoresist, the devices can be measured to confirm their resistive value. If the value is less than desired, the value can be adjusted upward, by additional chemical etching. This chemical "trimming" is much more economical than conventional laser trimming, where each element of the matrix is adjusted individually. As a result of carrying out the process of FIGS. 2A–G, a thick film patterned resistor with resistor lines having a width W of 0.0001 to 0.0015 inches, preferably 0.0005 to 0.020 inches.

Typically, thick or thin film conductor terminations or pads are applied after the devices are patterned. It is possible to apply and fire the conductor traces first, but special care must be exercised to prevent damage during the subsequent patterning of the multiphase thick film inks. Typically, conductor terminations pads are sized appropriately for thick film paste application by screen printing of thick film conductor inks. The ink is dried and then fired at carefully controlled times and temperatures. Typically, temperature is held at a peak of 850° C., in a controlled gas environment. This firing also reflows the patterned multiphase ink and improves the stability of the product.

EXAMPLES

Example 1

Method for Fabrication

A uniform thickness of Kamaya RLP-3108 thick film resistor ink is applied to a 99.6 wt % alumina substrate by screen printing a 3 inch square block on a 3.5 inch square substrate. The ink is then dried and fired in accordance with Kamaya recommendations for temperature profile and gas environment.

A layer of AZ1518 photoresist is applied by spin coating over the film of resistor ink at 1500 RPM in an SCS Model 6708D 8" Desk-Top Precision Spin Coating System and prebaked on a Corning hotplate for 60 seconds at 90° C.

The resist coated substrate is covered with a photomask having transparent regions in areas where the thick film will be etched away. The masked substrate is exposed in an ABM Mask aligner for 10 seconds at 1000 Watts, an intensity of 45 mW/cm$^2$. This imagewise exposure is followed by a post exposure bake on a Corning hotplate for 60 seconds at 90° C. The cooled substrate is developed in AZ 300MIF Developer for 33 seconds at room temperature. The developed plate is hard-baked four minutes at 135° C. and cooled to room temperature.

Next, the thick film resistor material, which is uncovered by development of the photoresist layer, is etched using an etchant, consisting of one part, but volume, of concentrated hydrofluoric acid, one part concentrate nitric acid, and one part water. The substrate is immersed in the 1:1:1 etchant for 5 seconds. It is then immersed in clean water to remove most of the acid. It is then rinsed by a directed stream of clean water and mechanically wiped with a cleanroom cloth to remove undissolved resistor particles. Moderate pressure is applied during the wiping. It is desirable to remove the particles without damaging the photoresist. The substrate is then again immersed in the etchant for another 5 seconds, rinsed and again wiped with the cloth.

Three cycles of etching, rinsing, and mechanical scrubbing are carried out to achieve optimum pattern transfer, in this example.

Next, the etched plate is ultrasonically cleaned with LiquiNox, a neutral –pH detergent available from Alconox, to remove remaining resistor particles to leave clean substrate between the patterned lines.

The remaining photoresist is then removed from the substrate with 60 second immersion in AZ 300T stripper followed by rinsing and ultrasonic cleaning with LiquiNox and three ultrasonic rinses in pure water.

Electrical contact pads are then created by screening Metech 3610 gold conductor thick film ink. The conductor ink was dried and fired at the same conditions as the resistor ink. The substrate was then cut using a dicing saw, to the final ship size.

Figure 3:
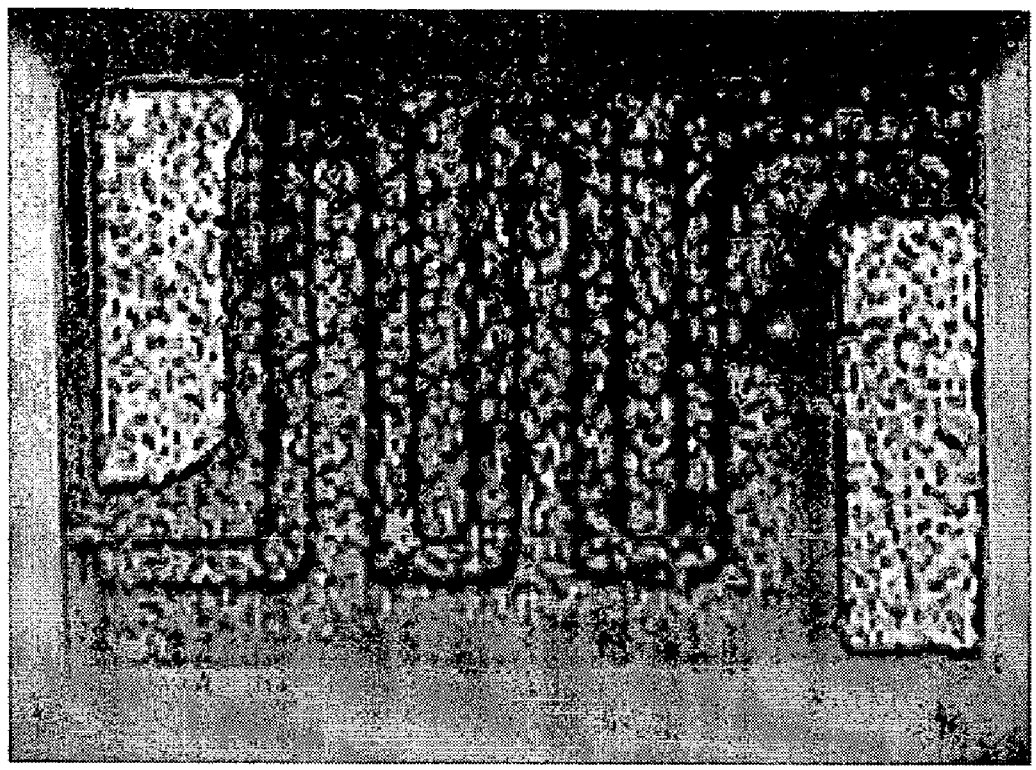
FIG. 3 shows a chip resistor made in accordance with the present invention.
Figure 4:
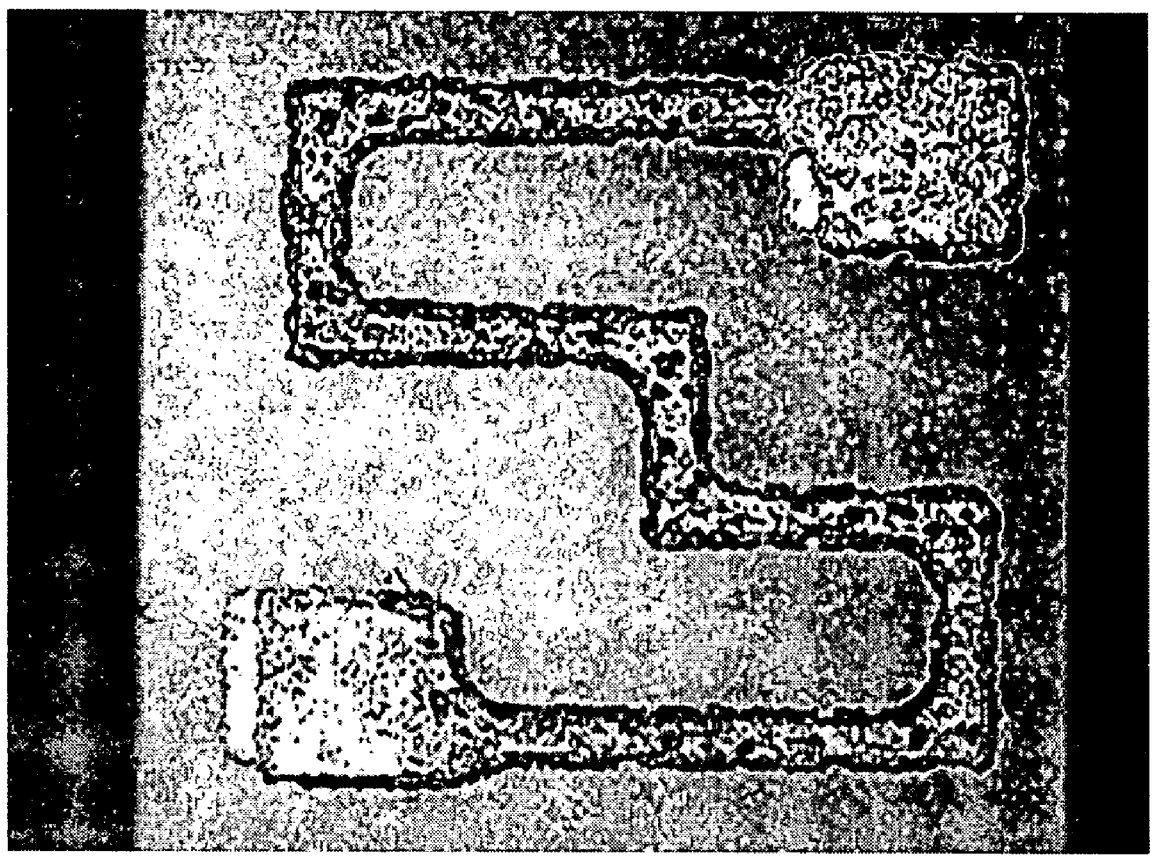
FIG. 4 shows a chip resistor made in accordance with the present invention.

Using this technique, a chip resistor having a 40×30 mil size and a resistance value of 30 gigaohms (30×10$^9$ ohms), but with a line width of 2 mils and aspect ratio of 63 was patterned as shown in FIG. 3. The resistive ink had a resistivity of 0.5×10$^9$ ohms/cm$^2$. The VCR was –550 ppm/V, and the TCR was –200 ppm/° C.

For the purpose of comparison, a 40×30 mil resistor with an ohmic value of 30 gigaohms (30×10 ohms) was made using a direct-write technique. The nominal line width was 5.5 mils, the aspect ratio was 16, and the resistivity of the thick film was 2.0×10$^9$ ohms/cm$^2$. The finished part had a VCR of –2000 ppm/V and a TCR of –550 ppm/° C.

Example 2

Method for Fabrication

A uniform thickness of Kamaya RLP-3109 thick film resistor ink is applied to a 96 wt % alumina substrate by screen printing a 3 inch square block on a 3.5 inch square substrate. The ink is then dried and fired in accordance with Kamaya recommendations for temperature profile and gas environment.

A layer of AZ1518 photoresist is applied by spin coating over the film of resistor ink at 1500 RPM in an SCS Model 6708D 8" Desk-Top Precision Spin Coating System and prebaked on a Corning hotplate for 60 seconds at 90° C.

The resist coated substrate is covered with a photomask having transparent regions in areas where the thick film will be etched away. The masked substrate is exposed in an ABM Mask aligner for 10 seconds at 1000 Watts, an intensity of 45 mW/cm$^2$. This imagewise exposure is followed by a post exposure bake on a Corning hotplate for 60 seconds at 90° C. The cooled substrate is developed in AZ 300MIF Developer for 33 seconds at room temperature. The developed plate is hard-baked four minutes at 135° C. and cooled to room temperature.

Next, the thick film resistor material, which is uncovered by development of the photoresist layer, is etched using an etchant, consisting of one part, by volume, of concentrated hydrofluoric acid, one part concentrate nitric acid, and two parts water. The substrate is immersed in the 1:1:2 etchant for 30 seconds. It is then immersed in clean water for 5 seconds, then 20 seconds in 1:1:2 etchant, and rinsed in clean water. It is immersed in a Branson CH1012-40-12 Ultrasonic Cleaning Tank containing 1% Det O Jet detergent at 80° C., available from Alconox, 30 Glenn Street, Suite 309, White Plains, N.Y. 10603. The loosely bound particles are ultrasonically removed in about 20 seconds. The plate is thoroughly rinsed in clean water.

The remaining photoresist is then removed from the substrate with 60 second immersion in AZ 300T stripper followed by rinsing and ultrasonic cleaning with LiquiNox and three ultrasonic rinses in pure water.

Electrical contact pads are then created by screening Metech 3610 gold conductor thick film ink. The conductor ink was dried and fired at the same conditions as the resistor ink. The substrate was then cut using a dicing saw, to the final chip size.

Using this technique, a chip resistor having a 40×30 mil size and a resistance value of 60 gigaohms (60×10$^9$ ohms), but with a line width of 3 mils and aspect ratio of 28 was patterned as shown in FIG. 3. The resistive ink has a resistivity of 2.14×10$^9$ ohms/cm$^2$. The VCR was –450 ppm/V, and the TCR was –100 ppm/° C.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the claims which follow.

What is claimed is:

1. A method of producing a thick film patterned resistor on a substrate, said method comprising:
   providing a substrate with opposed surfaces, wherein one surface is coated with a layer of a resistor composition;
   applying a photoresist over the layer of the resistor composition;

forming a desired pattern in the photoresist, wherein the pattern leaves certain regions of the resistor composition layer uncovered by the photoresist;

etching the resistor composition layer which is uncovered by the photoresist under conditions effective to leave a mass of bound resistor particles at regions of the resistor composition layer which are not covered by photoresist; and removing the mass of unbound resistor particles from the substrate to produce a thick film patterned resistor on the substrate.

2. The method according to claim 1, wherein the substrate is selected from the group consisting of alumina, beryllium oxide, aluminum nitride, sapphire, magnesium titanate, barium titanate, neodymium titanate, zirconium tin titanate, zirconia toughened alumina, yttria partially stabilized zirconia, boron nitride, diamond, silicon, and silicon coated with insulating material.

3. The method according to claim 1, wherein the resistor composition comprises a binder and etchant insoluble particles.

4. The method according to claim 3, wherein the binder is selected from the group consisting of aluminum, barium, bismuth trioxide, boroaluminosilicate glass, boron, calcium oxide, copper, fused silica (amorphous), gadolinium, glass fit, lead, lead compounds, leaded glass frit, manganese compounds, potassium, ruthenium, silica (amorphous), sodium, $TiO_2$, vanadium, zinc, zirconium, and zirconium silicate.

5. The method according to claim 3, wherein the etchant insoluble particles are selected from the group consisting of oxides or oxide compounds of indium, thallium, ruthenium, palladium, tungsten, osmium, iridium, and rhodium as well as gold, silver, platinum, and palladium, either in elemental form or in compounds.

6. The method according to claim 1, wherein the layer of the resistor composition has a thickness of 0.0001 to 0.0015 inches.

7. The method according to claim 1, wherein the photoresist is selected from the group consisting of positive working photoresist, negative working photoresist, photo imageable epoxy, photo imageable polyimide, and dry sheet resist.

8. The method according to claim 1, wherein said forming a desired pattern in the photoresist comprises:

exposing the photoresist imagewise to light under conditions effective to form a latent image and developing the exposed photoresist under conditions effective to form a pattern in the photoresist.

9. The method according to claim 1, wherein said removing is carried out by water pressure, ultrasonic agitation, ultrasonic agitation with detergent application, brushing, scrubbing, and combinations thereof.

10. The method according to claim 1 further comprising:

removing residual photoresist after said removing the mass of unbound resistor particles from the substrate.

11. The method according to claim 1, wherein the thick film patterned resistor has resistor lines having a width of 0.0005 to 0.020 inches.

12. The method according to claim 1, wherein the thick film patterned resistor has resistor lines with a serpentine configuration.

13. The method according to claim 1 further comprising:

firing the resistor composition before said applying a photoresist.

\* \* \* \* \*